United States Patent
Abowd et al.

(10) Patent No.: US 7,286,975 B2
(45) Date of Patent: Oct. 23, 2007

(54) METHOD FOR DEVELOPING EMBEDDED CODE FOR SYSTEM SIMULATIONS AND FOR USE IN A HMI

(75) Inventors: Peter S. Abowd, Birmingham, MI (US); Dimitri Khijniak, Ypsilanti, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 668 days.

(21) Appl. No.: 10/279,547

(22) Filed: Oct. 24, 2002

(65) Prior Publication Data
US 2004/0083451 A1 Apr. 29, 2004

(51) Int. Cl.
*G06F 9/45* (2006.01)

(52) U.S. Cl. .................. 703/22; 703/1; 703/2; 703/13; 716/1; 716/2

(58) Field of Classification Search .................. 703/13, 703/22; 717/104–106
See application file for complete search history.

(56) References Cited

U.S. PATENT DOCUMENTS

| | | | |
|---|---|---|---|
| 5,006,991 A | 4/1991 | Ohcoshi et al. | |
| 5,748,943 A | 5/1998 | Kaepp et al. | |
| 6,063,128 A | 5/2000 | Bentley et al. | |
| 6,081,654 A | 6/2000 | Morman et al. | |
| 6,110,216 A | 8/2000 | Weber et al. | |
| 6,144,954 A | 11/2000 | Li | |
| 6,224,249 B1 | 5/2001 | Ozawa et al. | |
| 6,268,853 B1* | 7/2001 | Hoskins et al. | 700/83 |
| 6,377,255 B1* | 4/2002 | Ishikawa | 345/418 |
| 2003/0187625 A1* | 10/2003 | Deguchi | 703/6 |
| 2004/0066908 A1* | 4/2004 | Hanke et al. | 378/901 |
| 2005/0119773 A1* | 6/2005 | Hashima et al. | 700/97 |
| 2005/0278670 A1* | 12/2005 | Brooks et al. | 716/5 |

* cited by examiner

*Primary Examiner*—Paul Rodriguez
*Assistant Examiner*—Andre Pierre-Louis
(74) *Attorney, Agent, or Firm*—Dickinson Wright PLLC

(57) ABSTRACT

The present invention concerns a method and apparatus for integrating a CAD model of a product and an HMI simulation model of a product into a format suitable to be run in a virtual reality program. The method and apparatus according to the present invention includes the steps of providing a CAD model and a simulation model of the product. The simulation model includes an HMI simulation portion and an electronics/mechanical simulation portion. The CAD model and the HMI simulation portion of the simulation model are then integrated into a virtual reality representation of the product and modeled in the virtual reality program.

17 Claims, 3 Drawing Sheets

METHOD FOR DEVELOPING EMBEDDED CODE FOR SYSTEM SIMULATIONS AND FOR USE IN A HMI

BACKGROUND OF THE INVENTION

The present invention relates generally to development software and methods thereof and, in particular, to a method for developing embedded code for system simulations and for use in a Human Machine Interface (HMI) of a microcontroller-based product.

In recent years, the growth of consumer electronics productivity and communication products has begun to invade the automotive industry. Interior systems, where the bulk of a vehicle's Human-Machine Interface (HMI) exists, are becoming vastly complex. HMI devices (HMIs), such as "touch-screens" and the like, respond to commands executed by the occupants of the vehicle to display driving directions, operate the radio and climate controls, as well as emulate instrument panels. In order to respond to the commands of the vehicle occupants, software code for the display, functionality, and behavior of the HMI must be written, developed, and embedded within the product processor in order for the product to operate properly.

In the development of the embedded code for prior art HMIs, physical prototypes were necessary to model the product for human factors engineers and to demonstrate the product for potential sales. In the prior art, steps taken from product conception to the delivered software product included creating a two-dimensional image of the HMI display, converting the two-dimensional image to a three-dimensional CAD model, which could then be used in a prototype demonstration. The prototype typically consists of large surface data files that are viewed on large stereoscopic display systems. These are largely static images that may be able to display some dynamic characteristic such as lighting effects and change of surface colors and textures. These immersive technology prototypes are typically utilized for first-surface reviews. Code had to be written, debugged, and compiled for the prototype demonstration. After the demonstration, however, the software code developed for the prototypes was not usable in the final product, resulting in a waste of the resources utilized to create the prototype and a loss of the code used in the prototype.

In addition, in the early stages of the software development, the behaviors of the HMIs have traditionally been captured in a natural language engineering specification. These natural language specifications take great amounts of effort to create and refine and normally the result is a rather large document delivered very late in the development process. Often these documenting efforts last well into the development cycle and occur concurrently with product software development. Once software development has commenced, if the specification is incomplete, resolution of system performance details and other decisions will be made by the software designer and implemented in the product software without external documentation. When this occurs, the value and usefulness of the natural language specification drops dramatically. Additionally, the document is usually not retroactively updated if modifications in behavior are made directly to the source code instead of the document.

It is desirable, therefore, to reduce the dependence on the natural language specification and to reduce both the costs and the time required for developing HMI embedded code. Furthermore, it is desirable to establish a means of simulating the behavior of complete systems, including HMIs, prior to committing the expense of a full product prototype or product development.

SUMMARY OF THE INVENTION

The present invention concerns a method and apparatus for integrating a CAD model of a product and an HMI simulation model of a product into a format suitable to be run in a virtual reality program. The method and apparatus according to the present invention includes the steps of providing a CAD model and a simulation model of the product.

The simulation model includes an HMI simulation portion and an electronics/mechanical simulation portion. The CAD model and the HMI simulation portion of the simulation model are then integrated into a virtual reality representation of the product and modeled in the virtual reality program.

Preferably, the simulation model and the integrated HMI simulation portion and CAD model are created by a combination of HMI graphic design tools and state-based software design tools, which allow the product simulations to run in virtual reality and interact with the virtual models via virtual reality technology. Preferably, the CAD model and the HMI simulation portion of the simulation model are performed by characterizing said HMI simulation portion as a surface texture of the product in the virtual reality program.

Alternatively, the method and apparatus in accordance with the present invention are utilized for developing embedded object code for a controllable electronic product having a programmable user interface and a processor operable to execute the embedded code. The method and apparatus include the steps outlined above and also include modifying the HMI simulation portion of the simulation model in response to the performance of the integrated CAD model and simulation model in the virtual reality program. Object code modeled by the modified HMI simulation portion is then outputted and embedded in the product processor. The object code includes the HMI simulation portion and the electronics/mechanical simulation portion. Preferably, a two-dimensional industrial design product rendering is created and then formed into a three-dimensional electronic CAD surface model. Where the rendering contains products that have Human-Machine Interfaces (HMIs), a computer simulation of the product's HMI is created, and often there may be multiple products to simulate concurrently. Next, these HMI simulations are integrated with the CAD surface models and employ computer networking technology to form a system simulation in a format suitable to be operated in a virtual reality environment. The result is a full-scale, interactive system simulation. The HMI product simulations, when coupled with the CAD data, provide a full-scale interactive virtual product system.

The method and apparatus according to the present invention may be applied to a single embedded product or alternatively, to a system of products intended to work together, such as a full automotive interior electronics system. In this embodiment, the HMI product simulation portions may be connected to remote simulations representing the electronic and mechanical portions of the products. In this manner, users may remotely control simulations of a product's hardware from the simulation of the product's HMI.

Instead of creating the engineering specifications with text-based descriptions of intricate product behaviors of the prior art, simulations utilizing the method and apparatus according to the present invention may be engineered and utilized much more effectively to communicate behavioral aspects of the products to the customer. The present invention provides the ability to merge the simulations into the virtual reality models, which further provides the ability to place the simulated product, such as an HMI, right into the cockpit of the virtual vehicle. The automotive original equipment manufacturer (OEM) customer now sees the HMI in their vehicle's instrument panel (IP) and also is able to interact with it in the virtual world. During the requirements phase, these simulations are useful for communicating with the customer and validating intended behavior of the HMI because the simulations are often much more concisely expressive of the behavior than the natural language document of the prior art. Without having to release a single tool or ramp up any prototype build lines the present invention is able place a product simulation model into a virtual vehicle for a very high-fidelity customer or engineering review. Placing the full-scale, interactive product simulations into virtual vehicle cockpits, interiors or full vehicle models is an invaluable means of communicating many aspects of a product's design status and features to the customer.

The method and apparatus according to the present invention is quicker than ramping up a prototype build, requires fewer aspects of design to be completed before being able to communicate the product concept, and provides a means to examine behavior in a virtual reality environment rather than reading a document as in the prior art.

Preferably, the apparatus and method according to the present invention will be utilized to develop HMI products to be installed in a vehicle interior. Alternatively, the apparatus and method according to the present invention can be utilized for developing embedded code for any device that utilizes embedded code on a processor to operate a display while running on the processor including, but not limited to, mobile phones and handheld computers or personal digital assistants (PDAs).

The present invention provides an improved method for capturing the product requirements, simulating the product behavior and translating the simulation into actual embedded product object code.

DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
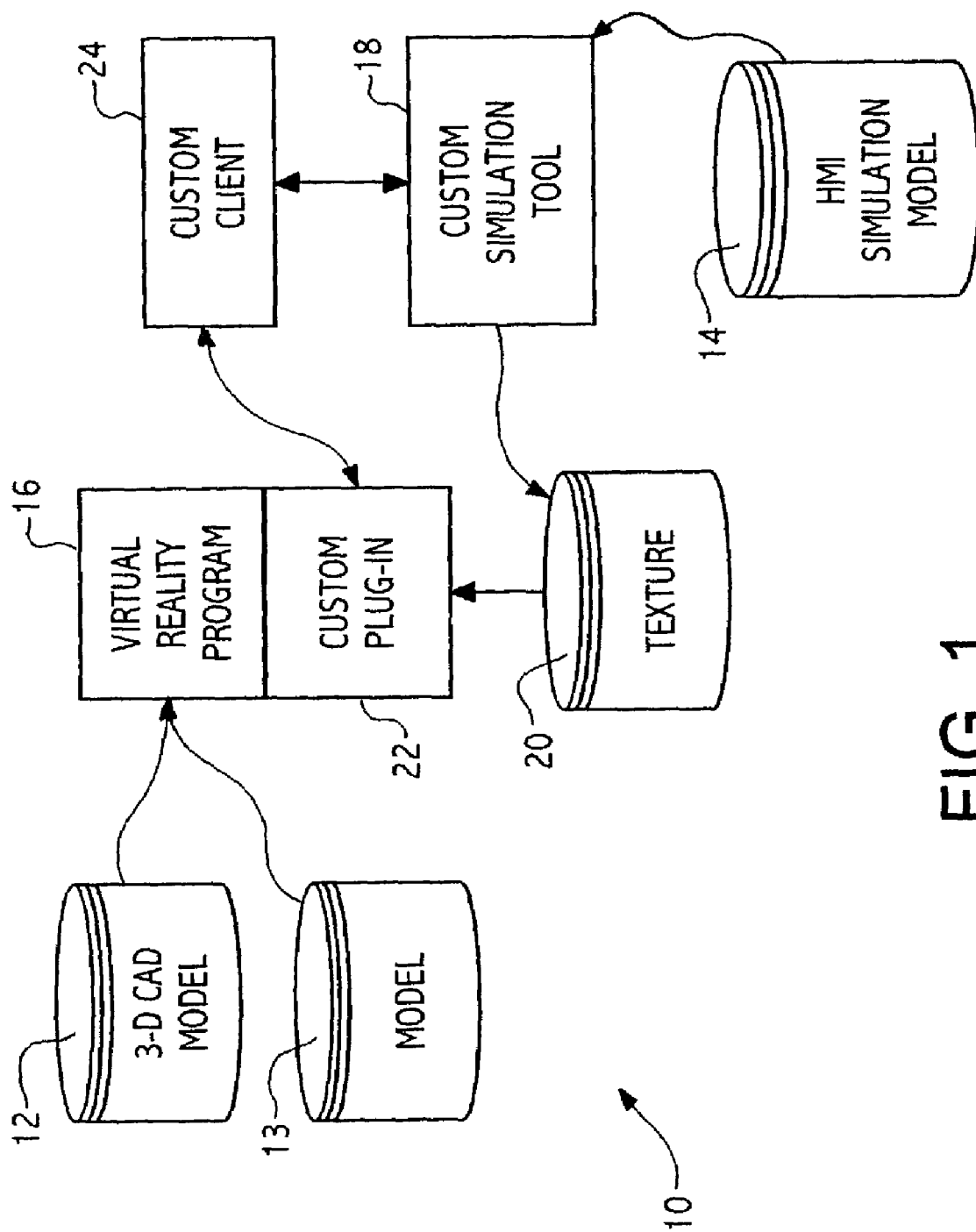
FIG. 1 is a flowchart depicting the overall development process for integrating a CAD model and an HMI simulation model in accordance with the present invention.

Referring now to FIG. 1, a depiction of an overall code development process according to the present invention is indicated generally at 10. The development process 10 concerns a method for integrating a computer-aided design (CAD) model 12 of a product (not shown), and a human machine interface (HMI) simulation model 14 of the product into a format suitable to be run in a virtual reality program 16. The product is, for example, a radio in an automotive vehicle (not shown) that includes both electro-mechanical components and a touch-screen HMI.

The CAD model 12 is preferably a three-dimensional CAD model that provides data to the virtual reality program 16, which allows the virtual reality program 16 to create a three-dimensional wire data surface (not shown) to display the product in a virtual reality representation (not shown). The CAD model 12 includes a virtual data interchange file model 13 that provides references for providing texture and events for the wire data surface when the virtual reality program 16 models the product.

The HMI simulation model 14 provides data to a simulation development tool 18, such as product display information and panel button behaviors. The tool 18 is operable to characterize the data from the simulation model 14 as a texture format (not shown) output the HMI simulation data of the product as a texture data 20. The texture data 20 is then provided to a custom plug-in 22, which is embedded in the virtual reality program 16 to allow the virtual reality program 16 to work with the data from the CAD model 12 and provide a texture to the three-dimensional wire data surface of the product when the virtual reality program 16 models the product. The CAD model 12 and the HMI simulation model portion 14 are now integrated into an integrated model (not shown), discussed in more detail below. When the virtual reality program 16 models the product, the plug-in 22 communicates with a client 24, which provides events to synchronize the modeling of the product in the virtual reality program 16. The client 24 is in communication with both the plug-in 22 and the simulation tool 18 during the modeling of the product in the virtual reality program 16. During modeling in the virtual reality program 16, the client 24 sends signals or messages to the plug-in 22 to indicate when the plug-in 22 should get new data from the texture data 20. Likewise, a user (not shown) in the virtual reality environment of the virtual reality program 16 interacts with the CAD model 12. If these interactions are intended to affect the HMI simulation model 14, then the plug-in 22 sends a message to the client 24 to get the simulation development tool 18 to affect a change in the simulation according to the HMI simulation model 14. This is a feedback loop of user to model and model out to user interaction, discussed in more detail below.

Figure 2:
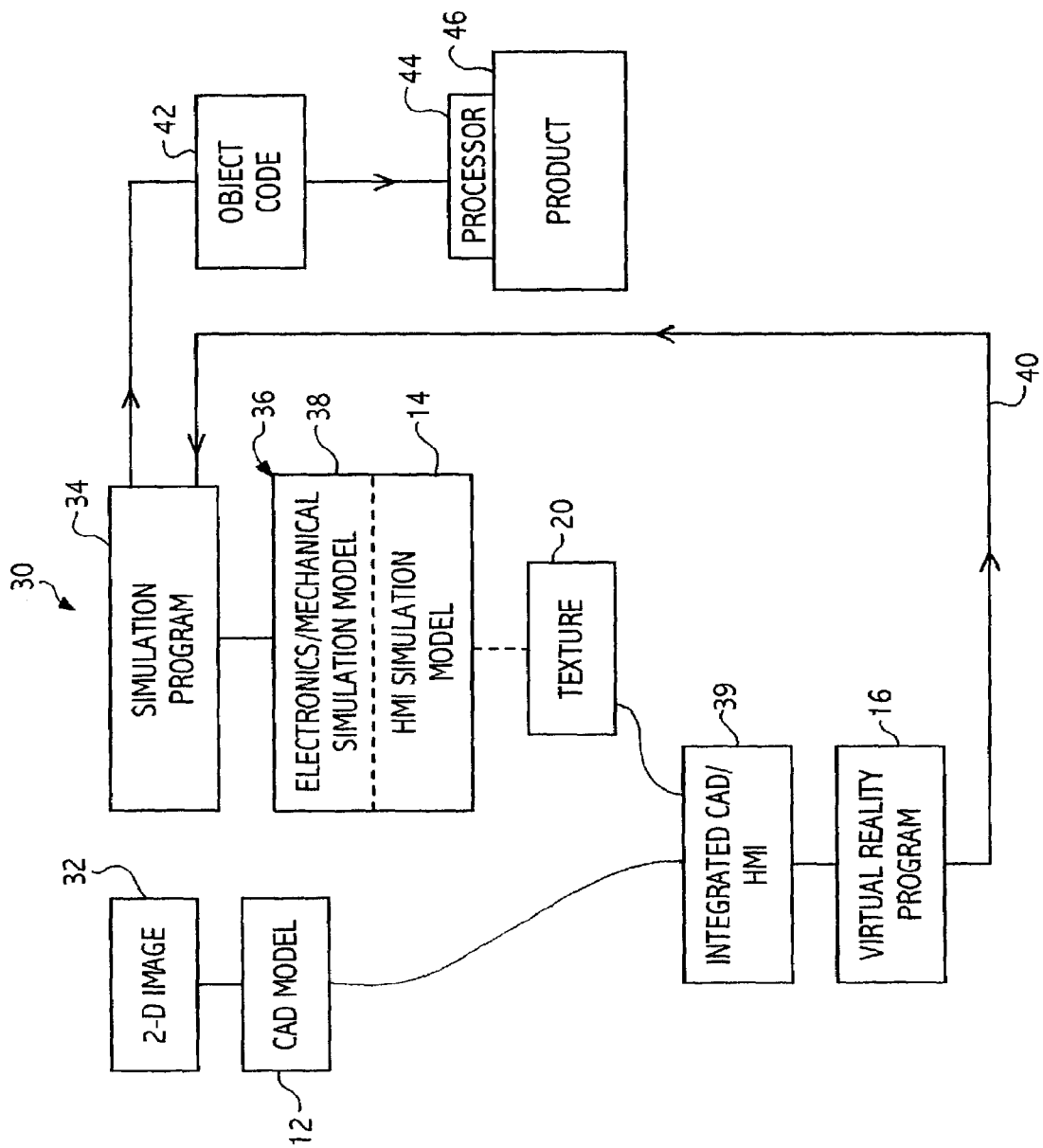
FIG. 2 is a flowchart depicting the overall development process for developing embedded objected code for a controllable electronic product in accordance with the resent invention.

Referring now to FIG. 2, an overall code development process for developing embedded object code is indicated generally at 30. The process 30 is operable to develop embedded objected code 42 for a controllable electronic product 46 such as a radio in an automotive vehicle (not shown). The product 46 includes both electro-mechanical components (not shown) and a touch-screen human machine interface (HMI) (not shown). The product 46 includes a processor 44 operable to execute the embedded object code 20 for the HMI.

The process 30 includes providing a two dimensional image 32 of a visual display of the HMI and then creating the CAD model 12 of the two dimensional image 32.

Preferably the two dimensional image is provided by an image creation means, such as a photo quality graphic rendering tool or the like. Preferably, the CAD model 12 is a three dimensional CAD model. A simulation model 36 is then provided by a simulation program 34. The simulation model 36 includes an electronics/mechanical simulation model portion 38 and the HMI simulation model portion 14. Data from the CAD model 12 and the HMI simulation model portion 14, including the texture data 20, are then integrated into an integrated CAD model and HMI simulation model portion 39, which is provided to the virtual reality program 16, best seen in FIG. 1. The integrated CAD model and HMI simulation model portion 39 is then modeled in the virtual reality program 16 and the HMI simulation model portion 14 is modified by feeding back changes via a feedback loop 40 in response to the performance of the integrated CAD model and HMI simulation model portion 39 in the virtual reality program 16. The HMI simulation model portion 14 may be modified as many times as necessary utilizing the feedback loop 40. When modifications are finished, an object code 42, based on the modified HMI simulation model portion 14, is then outputted and embedded in the processor 44. The processor 44 is then able to run the object code for the touch-screen HMI.

Figure 3:
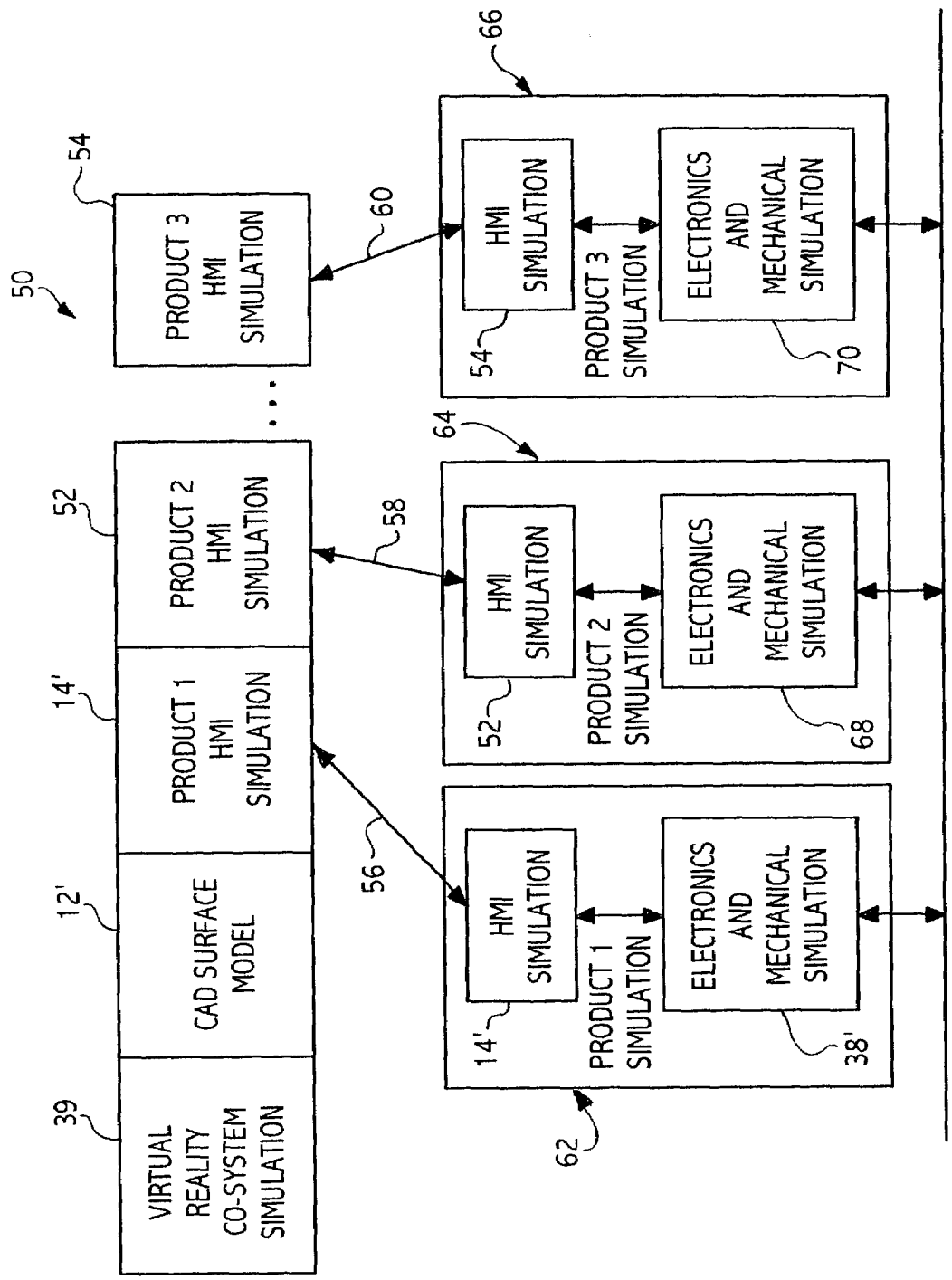
FIG. 3 is a block diagram of a distributed co-simulation architecture utilizing the method and apparatus in accordance with the present invention.

Referring now to FIG. 3, an architecture of a distributed co-simulation utilizing the method and apparatus in accordance with the present invention is indicated generally at 50. The architecture 50 includes the integrated CAD model and HMI simulation model portion 39 having the CAD model 12' and the HMI simulation model portion 14'. The process 50 also includes a second HMI simulation model portion 52, and a third HMI simulation model portion 54, which are all co-located at a design review locale and preferably running on a common server (not shown). Preferably, the simulation model portions 14', 52, and 54 are simulations of a system of products (not shown) intended to work together, such as a full automotive interior electronics system (not shown). The first simulation model portion 14' is connected by a network connection 56 to a first product simulation program 62. The second simulation model portion 52 is connected by a network connection 58 to a second product simulation program 64. The third simulation model portion 54 is connected by a network connection 60 to a third product simulation program 66.

Each product simulation program 62, 64, and 66 is located remotely from the HMI simulation model portions 14', 52, and 54 and each product simulation program 62, 64, and 66 connects the HMI simulation model portions 14', 52, and 56 to a respective electronics/mechanical simulation portion 38', 68, and 70, which represent the electronic and mechanical portions of the products. In this manner, users may remotely control simulations of a product's hardware from the simulation of the product's HMI.

In accordance with the provisions of the patent statutes, the present invention has been described in what is considered to represent its preferred embodiment. However, it should be noted that the invention can be practiced otherwise than as specifically illustrated and described without departing from its spirit or scope. For example, while the present invention has been described to be utilized to develop HMI products to be installed in a vehicle interior, the present invention can be utilized for developing embedded code for any device that utilize embedded code on the processor to operate a display while running on the processor including, but not limited to, mobile phones, handheld computers, or personal digital assistants (PDAs).

What is claimed is:

1. A method for integrating a CAD model of a product and an HMI simulation model of a product into a format suitable to be run in a virtual reality program, said method comprising the steps of:

a) providing a CAD model of the product;

b) providing a simulation model of the product, said simulation model including a HMI simulation portion and an electronics/mechanical simulation portion;

c) integrating the CAD model and the HMI simulation portion of the simulation model into a virtual reality representation of the product; and d) modeling the integrated CAD model and simulation model in the virtual reality program.

2. The method according to claim 1 wherein step c) is performed by characterizing said HMI simulation portion as a surface texture of the product in the virtual reality program.

3. A method for developing embedded object code for a controllable electronic product having a programmable user interface and a processor operable to execute the embedded code, said method comprising the steps of:

a) providing a CAD model of the product;

b) providing a simulation model of the product, said simulation model including a HMI simulation portion and an electronics/mechanical simulation portion;

c) integrating said CAD model and said HMI simulation portion of said simulation model into a virtual reality representation of the product; and d) modeling said integrated CAD model and simulation model in a virtual reality program;

e) modifying said HMI simulation portion of said simulation model in response to performance of said integrated CAD model and simulation model in the virtual reality program;

f) outputting object code modeled by said modified system, said object code including said HMI simulation portion and said electronics/mechanical simulation portion; and g) embedding said object code in the product processor.

4. The method according to claim 3 including, prior to step a), creating a two dimensional image of a visual display of the user interface and creating a CAD model of said two dimensional image.

5. The method according to claim 4 wherein said CAD model is a three dimensional CAD model.

6. The method according to claim 4 wherein said two dimensional image is created by a photo quality graphic rendering tool.

7. The method according to claim 3 wherein steps e) and f) are performed by a simulation program.

8. The method according to claim 3 wherein step c) is performed by characterizing said HMI simulation portion as a surface texture of the product in the virtual reality program.

9. The method according to claim 3 including performing steps a) through c) at least twice to provide a plurality of HMI simulation portions, and performing step d) utilizing the plurality of HMI simulation portions.

10. The method according to claim 9 wherein the virtual reality program performs step d) remotely from each of the plurality of HMI simulation portions.

11. An apparatus for developing embedded object code for a human machine interface, said apparatus comprising:
- a CAD tool for providing a CAD model of the product;
- a first modeling tool for providing a simulation model of the product, said simulation model including a HMI simulation portion and an electronics/mechanical simulation portion;
- an integration for integrating said CAD model and said HMI simulation portion of said simulation model into a virtual reality representation of the product; and
- a second modeling tool for modeling said integrated CAD model and simulation model in a virtual reality program;
- a modification portion for modifying said HMI simulation portion of said simulation model in response to performance of said integrated CAD model and simulation model in the virtual reality program;
- an output portion for outputting object code modeled by said modified system, said object code including said HMI simulation portion and said electronics/mechanical simulation portion; and
- an embedding portion for embedding said object code in the product processor.

12. The apparatus according to claim 11 wherein said CAD tool incorporates a two dimensional image of a visual display of the user interface.

13. The apparatus according to claim 11 wherein said CAD model is a three dimensional CAD model.

14. The apparatus according to claim 12 wherein said two dimensional image is created by photo quality graphic rendering tool.

15. The apparatus according to claim 11 wherein said integrating portion characterizes said HMI simulation portion as a surface texture of the product in the virtual reality program.

16. The apparatus according to claim 11 including a plurality of CAD tools and first modeling tools for providing a simulation model for a plurality of products, and wherein said second modeling tools utilizes the plurality of products when modeling said integrated CAD model and simulation model in a virtual reality program.

17. The apparatus according to claim 16 wherein the virtual reality program models the plurality or products remotely from each of the plurality of products.

\* \* \* \* \*

UNITED STATES PATENT AND TRADEMARK OFFICE
CERTIFICATE OF CORRECTION

PATENT NO. : 7,286,975 B2  Page 1 of 1
APPLICATION NO. : 10/279547
DATED : October 23, 2007
INVENTOR(S) : Peter S. Abowd and Dimitri Khijniak It is certified that error appears in the above-identified patent and that said Letters Patent is hereby corrected as shown below:

In The Specification:

Column 3, Line 63, should read as follows: -- trollable electronic product in accordance with the present --

In The Claims:

Claim 11, Column 7, Line 8, should read as follows: -- an integration portion for integrating said CAD model and said --

Claim 15, Column 8, Line 10, should read as follows: -- integration portion characterizes said HMI simulation por- --

Signed and Sealed this

Fifth Day of August, 2008

JON W. DUDAS
*Director of the United States Patent and Trademark Office*